(12) United States Patent
Nakada et al.

(10) Patent No.: US 6,774,401 B2
(45) Date of Patent: Aug. 10, 2004

(54) LIGHT EMITTING DIODE

(75) Inventors: Konosuke Nakada, Tokyo (JP); Dai Aoki, Tokyo (JP); Hayato Oba, Tokyo (JP); Masataka Kagiwada, Tokyo (JP)

(73) Assignee: Stanley Electric Co., Ltd. (JP)

( * ) Notice: Subject to any disclaimer, the term of this patent is extended or adjusted under 35 U.S.C. 154(b) by 0 days.

(21) Appl. No.: 10/617,732

(22) Filed: Jul. 14, 2003

(65) Prior Publication Data

US 2004/0036079 A1 Feb. 26, 2004

(30) Foreign Application Priority Data

Jul. 12, 2002 (JP) ........................................ 2002-203432

(51) Int. Cl.[7] .......................... H01L 27/15; H01L 31/12; H01L 33/00
(52) U.S. Cl. ........................................... 257/82; 257/81
(58) Field of Search .............................. 257/79, 81, 82, 257/88; 362/545

(56) References Cited

U.S. PATENT DOCUMENTS

| | | | | |
|---|---|---|---|---|
| 6,396,082 B1 | * | 5/2002 | Fukasawa et al. | 257/79 |
| 6,573,580 B2 | * | 6/2003 | Arndt | 257/433 |
| 6,586,721 B2 | * | 7/2003 | Estevez-Garcia | 250/221 |
| 6,597,019 B2 | * | 7/2003 | Inoue et al. | 257/99 |
| 6,700,137 B2 | * | 3/2004 | Horiuchi et al. | 257/81 |

* cited by examiner

Primary Examiner—S. V. Clark
(74) Attorney, Agent, or Firm—Dickstein, Shapiro, Morin, & Oshinsky, LLP.

(57) ABSTRACT

It is an object of the present invention to provide a wavelength conversion LED which improves light emitting efficiency through the use of a simple configuration. A LED comprising electrode terminals, a LED chip, a reflector having a bowl reflecting the light emitted from the LED chip to an opening, a enclosing resin filled into the bowl, and a wavelength conversion material mixed into the enclosing resin, absorbing the light emitted from the LED chip, and emitting light with a longer wavelength than that of the absorbed light is characterized in that the LED chip is connected to a electrode terminal inside the bowl, and in addition, a conductive reflective member for reflecting the light emitted from the junction surface without transparency thereof on the substantially whole surface is provided at the top surface of the LED chip, the density of the wavelength conversion material mixed into the enclosing resin is larger at the bottom of the junction surface of the LED chip than at the top thereof; and/or a wavelength conversion material layer is formed into a prescribed shape on the inside surface of the reflector with the bowl.

4 Claims, 3 Drawing Sheets

LIGHT EMITTING DIODE

BACKGROUND OF THE INVENTION

1. Field of the Invention

The present invention relates to a wavelength conversion LED such as a white light emitting diode in which blue light is emitted from a pn junction interface, this blue light is made incident on a fluorescent body to extract yellow light, and white light is emitted by mixing the blue light and yellow light, or alternatively, ultra-violet light is emitted from the pn junction interface and this ultra-violet light is made incident on the fluorescent body to extract intermediate colored light such as white light.

2. Detailed Description of the Prior Art

FIG. 6 shows a white LED as an example of a wavelength conversion LED known in the prior art.

In FIG. 6, a white LED 1 contains a white reflector 2 having a bowl 2a formed so as to open upward, a LED chip 3 disposed close to the center of the bowl 2a of the reflector 2, and an enclosing resin 4 containing wavelength conversion material 4a filled into the bowl 2a.

The reflector 2 has electrode terminals 2b, 2c which are integrated into a single body by an insert molding or the equivalent.

The LED chip 3 is formed so as to constitute a blue LED chip through the joining of InGaN (p-type) and Sic (n-type), and the pn junction surface 3a which constitutes the light emitting layer thereof is disposed in the expanded area near the upper edge.

In the LED chip 3, the n-side thereof is electrically connected to the electrode terminal 2b exposed at the bottom of the bowl 2a of the reflector 2 while being fixed by, for example, a conductive adhesive; and the electrode 3b on the surface of the p-side thereof is connected by a wire 3c of metal or the like to the other electrode terminal 2c exposed at the bottom of the bowl 2a.

The enclosing resin 4 comprises a translucent resin and contains fluorescent a body 4a which emit yellow light when exposed to blue light. As the fluorescent the body 4a generally have a larger specific gravity than the enclosing resin 4, as a result of settling, the lower section thereof comprises a dense fluorescent body layer 4b as shown in the figure.

In the white LED 1 configured as described above, when a drive voltage is applied between the n-side and the p-side of the LED chip 3 by the electrode terminals 2b, 2c, blue light L1 is emitted from the junction surface 3a thereof. The blue light L1 emitted from the LED chip 3 is directed towards the opening and bottom of the bowl 2a of the reflector 2 and is approximately uniformly incident thereto.

The blue light L1 directed towards the opening of the bowl 2a of the reflector 2 is emitted upwards as it is. Meanwhile, the blue light L1 directed towards the bottom of the bowl 2a of the reflector 2 is incident on the fluorescent body layer 4b which has settled at the bottom of the bowl 2a. Accordingly, the fluorescent bodies 4a within the fluorescent body layer 4b absorb the blue light L1, and as a result of excitation, emit yellow light L2 in the form of fluorescent light. This yellow light L2 is mixed with the blue light L1 emitted upwards as it is from the opening as previously described, white light is produced overall; and this is emitted upward.

In contrast, a white LED 5 configured as shown in FIG. 7 is also known in the prior art.

In FIG. 7, the white LED 5 differs in construction with the white LED 1 from FIG. 6 in terms of the vertically-inverted disposition of the LED chip 3; consequently, the pn junction surface 3a of the LED chip 3 is disposed toward the bottom within the fluorescent body layer 4b of fluorescent bodies 4a in the enclosing resin 4.

Similarly, in the white LED 5 configured as described above, a portion of the blue light emitted at the junction surface of the LED chip 3 is absorbed by the fluorescent body 4a as it is passed through the fluorescent body layer 4b, and yellow light is emitted; in addition, the remaining portion of the blue light becomes transparent inside the LED chip 3 through the enclosing resin 4 above the fluorescent body layer 4b, and is emitted upwards from the enclosing resin 4.

As a result of this, the yellow light and blue light as described above are mixed, and white light is emitted upwards.

The following problems have been experienced with configurations characterized by the white LEDs 1, 5 as described above.

In both of the white LEDs 1, 5, a portion of the blue light is emitted upwards as it is from the opening in the bowl 2a of the reflector 2, and in order to obtain white light, yellow light with a light volume which counterbalances the light volume of this excessively-strong blue light is required. Accordingly, the volume of fluorescent bodies 4a which convert blue light to yellow light must be increased. Since the blue light and the yellow light are shielded by the fluorescent body particles, therefore, the volume of light which may be extracted at the opening of the bowl drops, and the overall light emitting efficiency of the white LEDs 1, 5 is reduced.

Furthermore, in the case of the LED chip which emits ultra-violet light, a mixture of fluorescent bodies which emit red, green, and blue light is often used; however, since ultra-violet light is emitted from the top of the chip directly to the opening in the bowl without being incident on the fluorescent bodies in this case also, this light does not contribute to the strength of the visible light extracted from the top, and the light emitting efficiency is reduced.

The similar type of problem occurs in other wavelength conversion LED with same configuration whose fluorescent body composition or the LED chip are modified to emit single colored, infrared, or intermediate colored light.

SUMMARY OF THE INVENTION

It is therefore an object of the present invention to provide a wavelength conversion LED which improves light emitting efficiency through the use of a simple configuration.

This object is achieved by the LED of the first embodiment of the present invention comprising electrode terminals, a LED chip, a reflector having a bowl reflecting the light emitted from the LED chip to an opening, a enclosing resin filled into the bowl, and a wavelength conversion material mixed into the enclosing resin, absorbing the light emitted from the LED chip, and emitting light with a longer wavelength than that of the absorbed light, and characterized in that the LED chip is connected to a electrode terminal inside the bowl, and in addition, a conductive reflective member for reflecting the light emitted from the junction surface without transparency thereof on the substantially whole surface is provided at the top surface of the LED chip; the density of the wavelength conversion material mixed into the enclosing resin is larger below the junction surface of the LED chip than thereabove; and/or a wavelength conversion material layer is formed into a prescribed shape on the inside surface of the reflector with the bowl.

In this first embodiment, light is emitted from the junction surface of the LED chip as a result of application of drive voltage from both electrode terminals to the LED chip via the conductive reflective member and is reflected downward by the conductive reflective member.

All or some of the downward directed light is absorbed by the wavelength conversion layer, and wavelength converted light is emitted there.

Accordingly, when the color of the light emitted by the LED chip is blue, the blue light which is not absorbed by the wavelength conversion layer is mixed with the yellow light emitted by the wavelength conversion layer, and is emitted from the top to the exterior as white light. Furthermore, when ultra-violet light is emitted by the LED chip, this ultra-violet light is converted by the wavelength conversion layer and emitted to the exterior as white light. Consideration has been given for diodes which emit non-white light using combinations of wavelength conversion material and LED chip emission wavelength, for example, violet light emission diodes which emit violet light through the combination of a blue LED chip and fluorescent bodies which emit red light, and infrared light emission LED which combines an ultra-violet LED chip with fluorescent bodies emitting infrared light. However, the constitution according to the present invention makes no distinction in terms of wavelength conversion material or LED chip type.

In this case, the light reflected downward by the conductive reflective member is always directed to the high density layer of wavelength conversion material at the bottom of the LED chip, and consequently, the light emitted directly to the exterior from the top of the chip without being converted by the wavelength conversion material is reduced. Therefore, in contrast to the prior art in which a suitable amount of wavelength conversion material must be included in the enclosing resin to fully convert the wavelength of the light emitted upward in order that white light or light of any other intended color may be obtained, the present invention allows the required volume of fluorescent bodies to be reduced. As a result, the light which was shielded from reaching the exterior by particles of the excessive volume of wavelength conversion material is obtainable at the exterior, and the efficiency of extraction is increased for the light emitted to the exterior.

The LED in accordance with the second embodiment of the present invention is characterized in that, in the LED in accordance with the first embodiment of the present invention, the primary side of the junction surface of the LED chip is formed so as to have a larger area than the secondary side thereof, and the side surface of the chip is inclined.

In this second embodiment of the present invention, the light advancing from the side of the junction surface toward a slightly upward direction is reflected downward by the expansion portion expanding in the direction of the primary surface side; consequently, light emitted directly upward from the LED chip can be completely eliminated.

The LED in accordance with the third embodiment of the present invention is further characterized in that, in the LED in accordance with the first embodiment or second embodiment of the present invention, the second conductive reflective member for reflecting the light emitted from the junction surface without transparency thereof on the substantially whole surface is provided at the bottom surface of the LED chip.

In this third embodiment of the present invention, the light emitted downward from the LED chip's junction surface is reflected upward at the bottom of the LED chip by the second conductive reflective member; consequently, there is no transparency downward from the bottom of the LED chip and no absorption by electrode terminals, conductive adhesives, or the like disposed therebeneath. In accordance, the efficiency of light output and the light emitting efficiency of the LED are improved.

The LED in accordance with the fourth embodiment of the present invention comprises electrode terminals, a nitride semiconductor-type LED chip provided on a conductive substrate, a reflector having a bowl reflecting the light emitted from the LED chip to an opening, a enclosing resin filled into the bowl, and a wavelength conversion material mixed into the enclosing resin, absorbing the light emitted from the LED chip, and emitting visible light; and is characterized in that the LED chip is connected to a electrode terminal inside the bowl, and in addition, a conductive reflective member for reflecting the light emitted from the junction surface without transparency thereof on the substantially whole surface is provided at the top surface of the LED chip; the density of the wavelength conversion material mixed into the enclosing resin is larger below the junction surface of the LED chip than thereabove; and/or a wavelength conversion material layer is formed into a prescribed shape on the inside surface of the reflector with the bowl.

A conductive substrate is used in this fourth embodiment, and for this reason, only one wire is needed to form an electrical connection with the electrode on the conductive reflective layer; consequently, the volume of light which is not available at the exterior as a result of shield by wires is reduced. Furthermore, since the emission of ultra-violet and blue light is carried out using the nitride semiconductor-type LED chip, a wide range of different types of fluorescent body can be combined to efficiently emit visible light with longer wavelengths, and consequently, light with a wide range of colors can be emitted with high levels of intensity.

BRIEF DESCRIPTION OF THE DRAWINGS

These and others and advantages of the present invention will become clear from following description with reference to the accompanying drawing, wherein.

EXPLANATION OF THE REFERENCES

Figure 1:
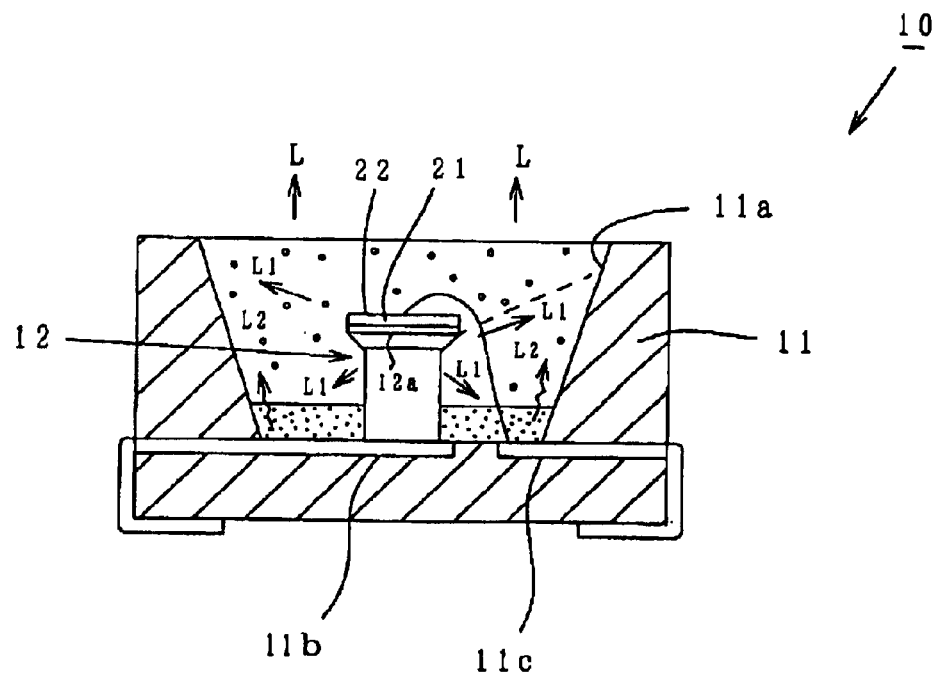
FIG. 1 is a schematic cross section view showing of a white LED according to the first embodiment of the present invention.

10: White LED
11: Reflector
11a: Bowl
11b: Electrode terminal

11c: Electrode terminal
12: LED chip
12a: Junction surface
13: Enclosing resin
13a: Wavelength conversion material
13b: Wavelength conversion material layer
21: Conductive reflective layer
21a: Output electrode
22: Electrode
31: Second conductive reflective layer
32: Second electrode
1: White LED as known in the prior art
2: Reflector
2a: Bowl
3a: LED chip
3b: pn junction surface
3c: Wire
4: Enclosing resin
4a: Suspended wavelength conversion material
4b: Wavelength conversion material layer
L: White light
L1: Blue light
L2: Yellow light

DETAILED DESCRIPTION OF THE PREFERRED EMBODIMENT

Hereinafter, the preferred embodiments of the present invention will be described in detail with reference to FIG. 1 through FIG. 5.

Since the embodiments described in the following constitute preferred examples of the present invention, various technical restrictions have been applied; however, the scope of the present invention is not limited to these embodiments except where otherwise stated in the following.

FIG. 1 shows a schematic view of the first embodiment of a white LED in accordance with the present invention.

In FIG. 1, a white light diode 11 contains a white reflector 11 having a bowl 11a formed so as to open upward, a LED chip 12 disposed in close vicinity to the center in the bowl 11a of the reflector 11, and an enclosing resin 13 including fluorescent substrate 13a filled into the bowl 11a.

The reflector 11 has electrode terminals 11b, 11c which are integrated into a single body by an insert molding or the like using non-translucent material such as plastic.

The LED chip 12 is formed so as to expand toward an electroconductive reflector as a blue light diode chip by joining of, for example, InGaN (p-type) and Sic (n-type), and the pn junction surface 12a as a light emitting layer is disposed in the expanded area near the upper edge.

The LED chip is formed into a mushroom-shape in which the main surface nearer to the pn junction surface 12a (the top surface) has a larger area than the other main surface (the bottom surface). The angle of the inclined sides of the mushroom-shape has been determined such that the expansion 12b thereof intersects with the side wall of the bowl 11a of the reflector 11 below the upper edge.

Although the LED chip 12 is illustrated using an example formed with a p-type InGaN layer on an n-type SiC substrate which is conductive and translucent, the manufacture is also possible using, for example, a GaN type layer on an insulating sapphire substrate.

Figure 2:
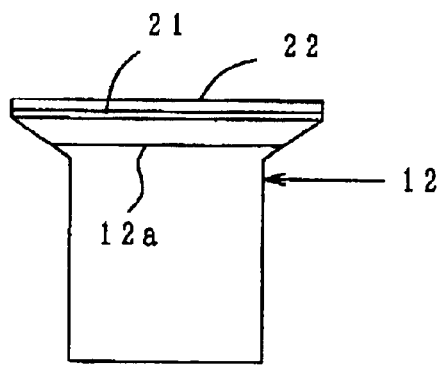
FIG. 2 is an enlarged side view of a LED chip from a white LED.
Figure 3:
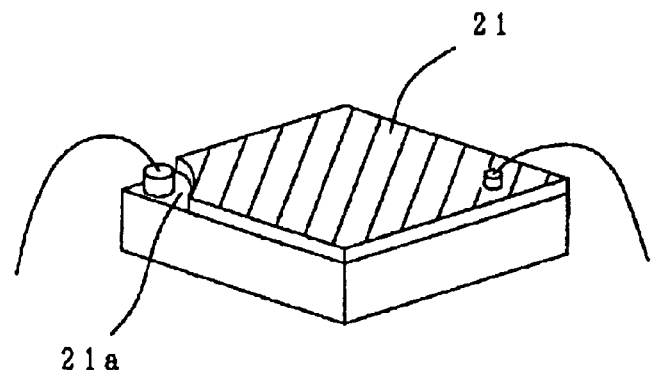
FIG. 3 is a schematic perspective view showing another typical configuration of a LED chip from a white LED of FIG. 1.

Furthermore, as a characteristic of the present invention, a conductive reflective layer 21 and an electrode 22 are formed in the LED chip in sequence at the top surface which constitute a conductive reflective member as shown in FIG. 2.

The conductive reflective layer 21 and an electrode 22 expand all over the top surface of the LED chip 12.

The conductive reflective layer 21 comprises a highly-reflective metal such as platinum Pt, Ag, or Rh. In contrast to Au as used in the prior art, these highly-reflective metals have a higher luminous efficiency for blue light, this having a wavelength equivalent to that for excitation of the wavelength conversion material. Moreover, since ohmic properties are also superior, usage is preferable in the present invention. Furthermore, the highly-reflective metals for preferable usage are suitably selected in accordance with the LED chip, wavelength conversion material, and other used members.

The conductive reflective layer 21 is formed into a prescribed shape on the wafer-type upper surface of the LED chip by vapor deposition or the like.

Furthermore, the electrode 22 is formed into a prescribed shape from a metal such as Au or AuZn by vapor deposition or the like.

When the LED chip is formed using a GaN type layer on a sapphire substrate as described above, as shown in FIG. 3, etching should be performed by photolithography or the like putting only the area 21a of an extract electrode under the exposed condition to expose the n-type conductive layer. After this, the conductive reflective layer 21 and electrode 22 should be formed into the prescribed shapes using photolithography or the like in conjunction with masking.

The n-side of the LED chip 12 is fixed and electrically connected using, for example, a conductive adhesive or eutectic bonding to an electrode terminal 11b exposed in the bowl 11a of the reflector 11. Furthermore, electrode 22 on the surface of the p-side of the LED chip 12 is connected to the other electrode terminal 11c, exposed in the bowl 11a of the reflector 11 using a wire 12b of a metal or the like.

The enclosing resin 13 comprises a translucent resin such as epoxy resin, and in this embodiment of the present invention, includes a floating wavelength conversion material 13a which generates yellow light after irradiated blue light.

While including the floating wavelength conversion material 13a, the enclosing resin 13 is filled into the bowl 11a of the reflector 11 and is hardened through heating or the equivalent.

Since the floating wavelength conversion material 13a generally has a larger specific gravity than the enclosing resin 13, as shown in the figure, settling occurs naturally during hardening, and a highly-dense wavelength conversion material layer 13b is formed at the bottom.

Accordingly, the volume of wavelength conversion material 13a mixed into the enclosing resin 13 is selected so as to form a wavelength conversion material layer 13b of the required thickness.

The white light diode 10 in accordance with this embodiment of the current invention is configured as described above, and when drive voltage is applied from the electrode terminals 11b, 11c directly to the n-side of the LED chip 12 and to the p-side of the LED chip 12 via the electrode 22 and the conductive reflective layer 21 respectively, the blue light L1 is emitted from the junction surface 12a thereof.

As a conductive reflective layer 21 is formed all over the top surface of the LED chip 12, the blue light L1 directed upward from the junction interface 12a is reflected by the conductive reflective layer 21 in downward direction. Even if the blue light L1 were to be permeated through the conductive reflective layer 21 at this time, it would be fully reflected downward by the electrode 22 disposed thereabove, and therefore, there is no direct upward emission of the blue light L1 from the upper surface of the LED chip 12.

Furthermore, the blue light L1 emitted in an upward direction from the side of the LED chip 12 is reflected downward by the section expanding in the direction of the conductive reflective member at the top of the LED chip 12, and therefore, there is no direct upward emission from the enclosing resin 13.

Consequently, the blue light L1 directed downward from the junction surface 12a of the LED chip 12 is incident on the bottom of the bowl 11a of the reflector 11.

Accordingly, a portion of the blue light L1 directed toward the bottom of the bowl 11a of the reflector 11 is incident on the wavelength conversion material layer 13b which has settled at the bottom of the bowl 11a. As a result of this, the wavelength conversion material 13a of the wavelength conversion material layer 13b absorbs the blue light L1 and through excitation emits the yellow light L2 which constitutes the wavelength conversion light. The yellow light L2 is emitted upward.

In this way, the yellow light L2 emitted upward is mixed with the blue light L1 emitted by the LED chip 12 upward from the opening in the bowl 11a of the reflector 11 as a result of reflection at the sides of the bowl 2a without absorption by the fluorescent body 13a; white colored light is produced overall; and this is emitted upward.

Here, the blue light L1 emitted from the junction surface 12a to the outside of the LED chip 12 and directly toward the opening in the bowl 11a of the reflector 11 is completely shielded by the conductive reflective layer 21 and the electrode 22, and consequently, there is no direct leakage of the blue light L1 to the exterior. Therefore, since there is no need to increase the volume of the yellow light L2 in order to counterbalance the leakage of the blue light L1, it is not necessary to include a large amount of wavelength conversion material 13a. Accordingly, since a small volume of wavelength conversion material 13a is sufficient, it is possible to reduce the amount of shielding of light by the wavelength conversion material itself, the luminous efficiency for the blue light L1 is improved, and the luminous efficiency for the overall white colored light L is increased.

The reflector or other members can be changed using a lead cap coated with a highly-reflective index metal and a electrode terminal disposed in the vicinity thereof; furthermore, the LED chip's light generation wavelength and the wavelength conversion material can be freely selected in order to obtain light of the desired color. These modifications are included as a matter of course in the scope of the present invention.

Figure 4:
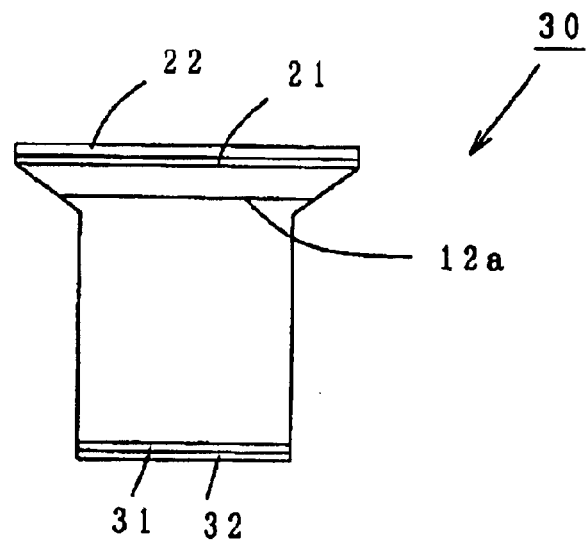
FIG. 4 is an enlarged side view of a LED chip from a white LED according to the second embodiment of the present invention.

FIG. 4 shows a view of the LED chip of the second embodiment of a white LED in accordance with the present invention.

Here, the LED chip 30 has the similar configuration to that of LED chip 12 from the white LED 10 in FIG. 1 and differs only in the formations of a second conductive reflective layer 31 and a second electrode 32 which, in a similar fashion to the conductive reflective layer 21 and the electrode 22 on the upper surface, are formed into a prescribed shape on the entire bottom surface thereof.

According to a white LED using the LED chip 30 of the above-described configuration, the upward directed portion of the blue light L1 directed from the junction surface 12a of the LED chip 30 is fully reflected downward by the conductive reflective layer 21 and the electrode 22 disposed on the top surface, and in addition, the downward directed portion thereof is fully reflected upward by the second conductive reflective layer 31 and the second electrode 32 disposed on the bottom surface. Moreover, eutectic bonding is suitable for mutual connection of the second conductive reflective layer 31 and the second electrode 32.

Accordingly, in contrast to the white LED 10 from FIG. 1, there is no absorption of the light incident on the bottom surface of the LED chip 30 by the electrode terminal 11b, the conductive adhesive, or any other members disposed thereneath. As a result of this, the blue light L1 entering the enclosing resin 13 from the LED chip 30 increases in magnitude, and consequently, the efficiency of the white LED in the generation of the white light L is further increased.

Furthermore, of the light emitted from the junction surface of the LED chip 30, the portion directed toward the top of the chip is reflected downward by the electrode 22 and/or the conductive reflective layer 21, and almost no light is emitted upward from the top of the chip. Accordingly, when the white LED 1 is observed, the light emitted directly from the strong LED chip 30 is reduced, and the light emitted from the wavelength conversion material 13a accounts for almost all of the observable light. That is to say, when light emitted directly toward the top of the chip as known in the prior art is present, since this light directed toward the top of the chip is strong, the light passed through the wavelength conversion layer is observed with a color characteristic of the mixing of the light emitted from the LED chip with the light from the wavelength conversion material; furthermore, when a blue LED was used and the distribution of light emission from a white LED was measured, color inconsistency occurred in the vicinity of the white LED in the form of blue-colored spot light on the front surface. In the present invention, however, the strong upward-directed light is reflected, and therefore, the direct emission of light is reduced and the emission of light without color inconsistency is achievable.

In the present invention, any LED chip capable of emitting light which can excite fluorescent bodies may be suitably used. Nitride based, compound-semiconductor light emitting elements; zinc-selenide based, compound semiconductor light emitting elements; and zinc-oxide based, compound-semiconductor light emitting elements grown on sapphire substrate or SiC substrate are typical examples. A nitride based, compound-semiconductor light emitting element grown on SiC substrate is the most preferable example in accordance with the fact that SiC substrate is conductive and is also translucent at the corresponding light-emission wavelengths, and consequently, it absorbs none of the light emitted by the pn junction or fluorescent body; furthermore, since there is no need to manufacture an electrode on the same surface of the chip, a conductive reflective layer can be formed with a more-complete shape on the top of the chip.

In the present invention, any preferred wavelength conversion material capable of being excited at the LED chip's light-emission wavelength and of emitting light of a longer wavelength may be used. YAG-based fluorescent material, SrS-based fluorescent material, $YBO_2$-based fluorescent material, $YVO_4$-based fluorescent material, and $CaLa_2S_4$-based fluorescent material are typical examples of the many types of wavelength conversion material which are preferred for usage with the above-mentioned preferred LED chip.

Hereinafter, an actual experimental sample of the above-described white LED 10 will be described.

Figure 5:
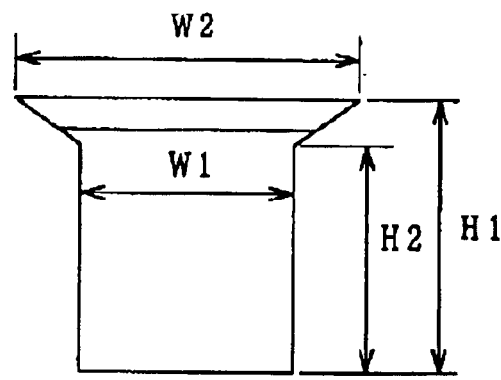
FIG. 5 is a schematic side view showing the actual configuration of a LED chip from an experimental sample of the white LED from FIG. 1.
Figure 6:
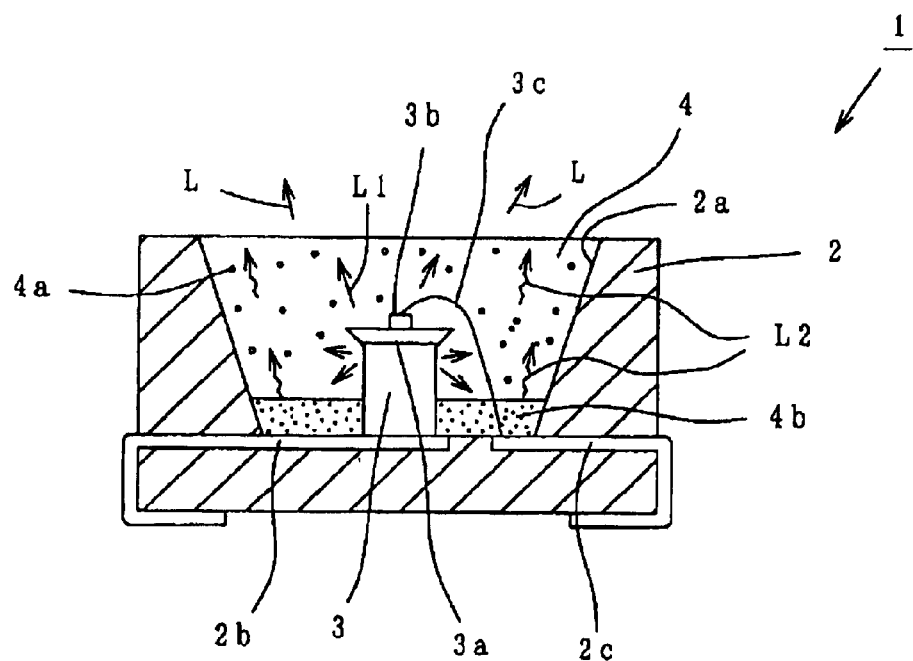
FIG. 6 is a sectional shield diagram showing a schematic view of a typical white LED known in the prior art.
Figure 7:
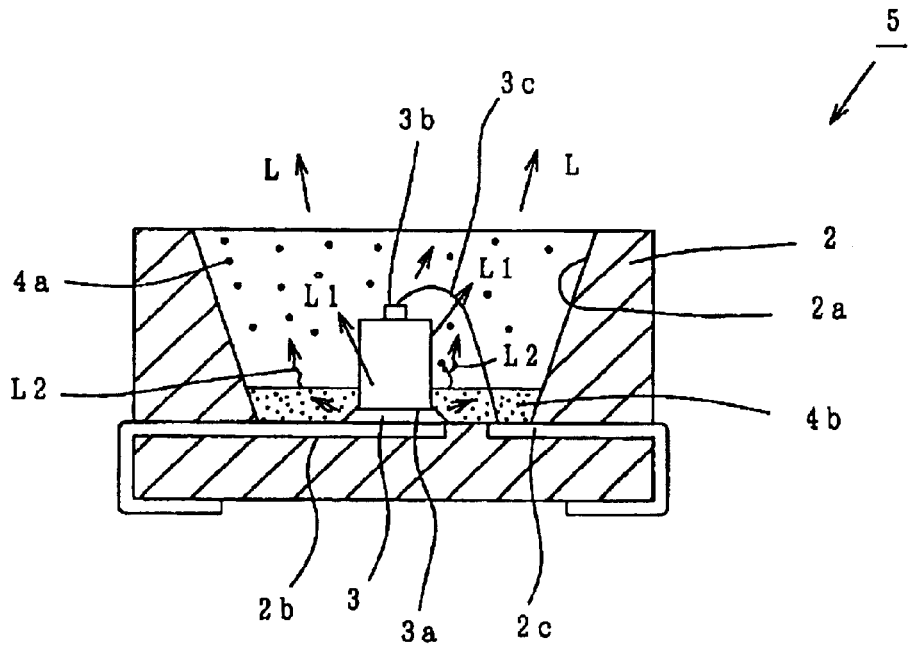
FIG. 7 is a sectional shield diagram showing a schematic view of another white LED known in the prior art.

The LED chip shown in FIG. 5 is manufactured in the capacity of the above-mentioned LED chip 12. Here, the LED chip 12 is formed with a mushroom-type shape so as to have an overall width W1 of 200 μm on all four sides, a height H1 of 250 μm, an inclined extension beginning at a height H2 of 200 μm, and a width W2 of 290 μm on all four sides at a height of 250 μm. On the top surface of such a LED chip, a conductive reflective film 21 is formed by vapor deposition of platinum Pt, and an electrode 22 is then formed by vapor deposition of Au.

A LED-chip 12 configured in this way was implemented within a bowl 11a of a reflector 11, and a enclosing resin 13 was filled and hardened therein to create a white LED 10. In order to provide a comparative sample of the prior art wherein the conductive reflective layer 21 and the electrode 22 are not present, a white LED was created by implementing the LED chip 12 in the bowl 11a of the reflector 11 in a vertically inverted condition.

For both the experimental sample and the comparative sample, the light intensity on the axis Iv and total luminous flux Im were measured before and after filling of the enclosing resin 13. For the comparative sample, pre-filling measurements were Iv=192 mcd and Im=0.528, and post-filling measurements were Iv=626 mcd and Im=1.623, whereas for the experimental sample, pre-filling measurements were Iv=162 mcd and Im=0.461, and post-filling measurements were Iv=650 mcd and Im=1.689.

In the comparative sample, the filling of enclosing resin (or in other words, the generation of yellow light through the excitation of fluorescent body) resulted in Iv increasing by a factor of 3.26 and Im increasing by a factor of 3.07, whereas in the experimental sample, the filling of enclosing resin resulted in Iv increasing by a factor of 4.01 and Im increasing by a factor of 3.66; accordingly, it was confirmed that in the experimental sample in accordance with the present invention the efficiency of light generation was increased with respect to a comparative sample typical of the prior art.

Whereas the conductive reflective films 21, 31 in the above-mentioned embodiment each comprise a single-layered thin film of a highly-reflective index metal such as platinum Pt, any other highly-reflective index metals such as Ag or Rh, or any highly-reflective index metal alloys could be well used, and furthermore, laminates comprising a multiplicity of these metals and metal alloys could also be formed. In addition, the color of the emitted light is not restricted to white and can be freely changed through the combination of different LED chips and fluorescent body.

Thus, in the present invention, by applying a drive voltage from the two electrode terminals to the LED chip via the conductive reflective members, light is emitted from the LED chip's junction surface and reflected downward by the conductive reflective member, and all or some of the downward directed light is absorbed by the wavelength conversion material layer and wavelength-converted light is emitted therein. As a result of this, for example, the blue light not absorbed by the wavelength conversion material layer and the yellow light from the wavelength conversion material layer are mixed and emitted upward to the exterior in the form of white light.

Here, the light which is emitted directly upward from the junction surface is reflected downward by the conductive reflective member and is always directs on the high density layer of wavelength conversion material at the bottom of the LED chip; consequently, the light which is emitted directly to the exterior without being converted by the wavelength conversion material is reduced. Therefore, in contrast to the prior art wherein a suitable amount of wavelength conversion material must be included in the enclosing resin in order to convert the upward emitted light into sufficiently strong light of white or any other intended color, the present invention allows the required volume of wavelength conversion material to be reduced. As a result, the white light which was shielded from reaching the exterior by particles of the excessive volume of wavelength conversion material is obtainable at the exterior and the efficiency of extraction is increased for white light emitted to the exterior.

Thus, according to the present invention, a wavelength conversion LED which improves light emitting efficiency can be provided through the use of a simple configuration.

While the presently preferred embodiment of the present invention has been shown and described, it will be understood that the present invention is not limited thereto, and that various changes and modification may be made by those skilled in the art without departing from the scope of the invention as set fourth in the appended claims.

What is claimed is:

1. A light emitting diode, comprising electrode terminals, a LED chip, a reflector having a bowl reflecting the light emitted from said LED chip to an opening, an enclosing resin filled into the bowl, and a wavelength conversion material mixed into said enclosing resin, absorbing the light emitted from said LED chip, and emitting light with a longer wavelength than that of the absorbed light; and characterized in that:

said LED chip is connected to the electrode terminals inside the bowl, and in addition, a conductive reflective member for reflecting the light emitting from a junction surface without transparency thereof on the substantially whole surface is provided at the top surface of said LED chip, the density of the wavelength conversion material mixed into said enclosing resin is denser below the junction surface of said LED chip than thereabove; and/or a wavelength conversion material layer is formed on the inside surface of the reflector with the bowl.

2. The light emitting diode of claim 1, further characterized in that:

a primary surface side of the junction surface of said LED chip is formed so as to have a larger area than a secondary surface side thereof, and the side surface of the chip is inclined.

3. The light emitting diode of claim 1 or 2, further characterized in that:

a second conductive reflective member for reflecting the light emitted from the junction surface without transparency thereof on the substantially whole surface is provided at the bottom surface of said LED chip.

4. A light emitting diode, comprising electrode terminals, a nitride semiconductor-type LED chip provided on a conductive substrate, a reflector having a bowl reflecting the light emitted from said LED chip to an opening, an enclosing resin filled into the bowl, and a wavelength conversion material mixed into said enclosing resin, absorbing the light emitted from said LED chip, and emitting visible light; and characterized in that:

said LED chip is connected to the electrode terminals inside the bowl, and in addition, a conductive reflective member for reflecting the light emitting from a junction surface without transparency thereof on the substantially whole surface is provided at the top surface of said LED chip; the density of the wavelength conversion material mixed into said enclosing resin is denser below the junction surface of said LED chip than thereabove; and/or a wavelength conversion material layer is formed on the inside surface of the reflector with the bowl.

* * * * *